US007233885B1

(12) United States Patent
Larabee et al.

(10) Patent No.: US 7,233,885 B1
(45) Date of Patent: Jun. 19, 2007

(54) SYSTEM AND METHOD FOR AUTOMATICALLY CUSTOMIZING A PRODUCT

(75) Inventors: John Larabee, Amelia, OH (US); Brian Pellegrino, Cincinnati, OH (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 483 days.

(21) Appl. No.: 10/877,172

(22) Filed: Jun. 25, 2004

Related U.S. Application Data

(60) Provisional application No. 60/482,620, filed on Jun. 26, 2003.

(51) Int. Cl.
*G06F 17/50* (2006.01)
(52) U.S. Cl. .................. 703/1; 703/7; 700/98
(58) Field of Classification Search .......... 703/7, 703/1; 705/26, 27; 700/98; 713/168, 202
See application file for complete search history.

(56) References Cited

U.S. PATENT DOCUMENTS

| 4,942,537 | A  | * | 7/1990  | Verry ..................... 703/1 |
| 6,009,406 | A  |   | 12/1999 | Nick |
| 6,029,142 | A  | * | 2/2000  | Hill ..................... 705/27 |
| 6,292,894 | B1 | * | 9/2001  | Chipman et al. .......... 713/168 |
| 6,343,275 | B1 |   | 1/2002  | Wong |
| 6,542,859 | B1 | * | 4/2003  | Burns et al. ............. 703/7 |
| 6,701,200 | B1 |   | 3/2004  | Lukis |
| 6,714,937 | B1 |   | 3/2004  | Eynon |
| 6,731,997 | B2 |   | 5/2004  | Hessel |
| 6,748,287 | B1 |   | 6/2004  | Hagen |
| 6,834,261 | B1 | * | 12/2004 | Andonian ................. 703/7 |
| 2002/0052862 | A1 |  | 5/2002  | Toren |
| 2003/0055674 | A1 |  | 3/2003  | Nishiyama |
| 2003/0069779 | A1 |  | 4/2003  | Menninger |
| 2003/0187753 | A1 |  | 10/2003 | Takaoka |
| 2004/0060014 | A1 |  | 3/2004  | Khalil |

OTHER PUBLICATIONS

Zave et al., P. Four darks corners of requirements engineering, ACM Transactions on Software Engineering and Methodology (TOSEM), Jan. 1997, pp. 1-30.*
Ernst et al., T. A flexible assembly global control simulation, Proceedings of the 25th Conference on Winter Simulation WSC '93, Dec. 1993, pp. 897-903.*
Learmonth, G.P. Information system technology can improve customer service, ACM SIGMIS Database, Dec. 1986, pp. 6-10.*

* cited by examiner

*Primary Examiner*—Russell Frejd

(57) ABSTRACT

Certain exemplary embodiments comprise a computer-assisted method for specifying a customized product, the method comprising: responsive to a request for product information from a user, identifying the product; if a standard product corresponds to the identified product: automatically initiating transmission of at least one document related to the standard product to the user in real-time; and if no standard product corresponds to the identified product: electronically forwarding the request for product information to an engineering entity. Certain exemplary embodiments comprise a computer-assisted method for designing a product, the method comprising: receiving a value for at least one design parameter related to a product from a user; if a value for each design parameter received from the user is within a pre-determined set for the design parameter, automatically designing predetermined aspects of the product responsive to the at least one of the design parameter value; and electronically providing a document regarding a designed product to the user.

32 Claims, 16 Drawing Sheets

4000

| Specification | Attributes | Design Goals | Modifications | 4100 |

Enter Title

_____ 4200

Enter Power Rating

_____ 4300

Enter Speed

_____ 4400

Enter Voltage

_____ 4500

Submit  4600

Fig. 4

SYSTEM AND METHOD FOR AUTOMATICALLY CUSTOMIZING A PRODUCT

CROSS-REFERENCES TO RELATED APPLICATIONS

This application claims priority to, and incorporates by reference herein in its entirety, pending U.S. Provisional Patent Application Ser. No. 60/482,620, filed 26 Jun. 2003.

BACKGROUND

United States Patent Application No. 20020052862 (Toren), which is incorporated by reference herein in its entirety, allegedly recites a "method and system for supply chain product and process development collaboration. The supply chain is comprised of at least one product, where each project is determined as a part (or family of parts), a supplier to supply the part, and a customer to be supplied the part. In one embodiment, the system includes a data storage and retrieval devise to hold project data, which, for each project, includes a project identifier, a part identified, a supplier identifier, a customer identifier, data representative of a methodology applicable to the project, and data representative of at least one control associated with processing of the project. The system and method of the present invention ensures that current methodologies applicable to a project are applied, and allows for collaboration between the customer and supplier during all phases of product and process design, development, and manufacture." See Abstract.

U.S. Pat. No. 6,701,200 (Lukis), which is incorporated by reference herein in its entirety, allegedly recites automated, "custom mold manufacture for a part begins by creating and storing a collection of information of standard tool geometries and surface profiles machinable by each of the standard tool geometries. A customer sends a CAD file for the part to be molded to the system. The system assesses the CAD file to determine various pieces of mold manufacturing information. One or more acceptability criteria are applied to the part, such as whether the part can be manufactured in a two-piece, straight-pull mold, and whether the mold can by CNC machined out of aluminum. If not, the system sends a file to the customer graphically indicating which portions of the part need modification to be manufacturable. With any such modifications, the system provides the customer with a quotation of the cost to manufacture the mold or a number of parts. The quotation is based upon mold manufacturing time as automatically assessed from the part drawings. The customer's part is geometrically assessed so the system automatically selects appropriate tools and computes tool paths for mold manufacture. In addition to the part cavity, the system preferably assesses the parting line, the shutoff surfaces, the ejection pins and the runners and gates for the mold. The preferred system then generates CNC machining instructions to manufacture the mold, and the mold is manufactured in accordance with these instructions." See Abstract.

U.S. Pat. No. 6,009,406 (Nick), which is incorporated by reference herein in its entirety, allegedly recites an "in-depth review of a product line is conducted, including customer interviews, in order to identify customer specifications that are more complex than customer needs. Customer needs are quantified, and a reduced set of standard product configuration classes are selected so that about 80% of customer orders based on actual customer needs can be satisfied by the standard product configuration classes, and the remaining orders can be satisfied by custom design. Major components in the standard products are themselves standardized. Manufacture of the standard product is optimized for a one-day manufacturing cycle and separated from the manufacture of the custom designed product. A sales office and manufacturing plant roll-out schedule is implemented and managed by computer-based spreadsheet tools. A product configuration computer program module is interfaced between a product selector and a materials management (MRP) system in order to automate the process of entering orders, designing the standard product, ordering parts, and scheduling assembly of standard product." See Abstract.

SUMMARY

Certain exemplary embodiments comprise a computer-assisted method for specifying a customized product, the method comprising: responsive to a request for product information from a user, identifying the product; if a standard product corresponds to the identified product: automatically initiating transmission of at least one document related to the standard product to the user in real-time; and if no standard product corresponds to the identified product: electronically forwarding the request for product information to an engineering entity. Certain exemplary embodiments comprise a computer-assisted method for designing a product, the method comprising: receiving a value for at least one design parameter related to a product from a user; if a value for each design parameter received from the user is within a pre-determined set for the design parameter, automatically designing predetermined aspects of the product responsive to the at least one of the design parameter value; and electronically providing a document regarding a designed product to the user.

BRIEF DESCRIPTION OF THE DRAWINGS

A wide variety of potential embodiments will be more readily understood through the following detailed description, with reference to the accompanying drawings in which:

FIG. 4 is a block diagram of an exemplary embodiment of a user interface 4000;

DEFINITIONS

Figure 1:
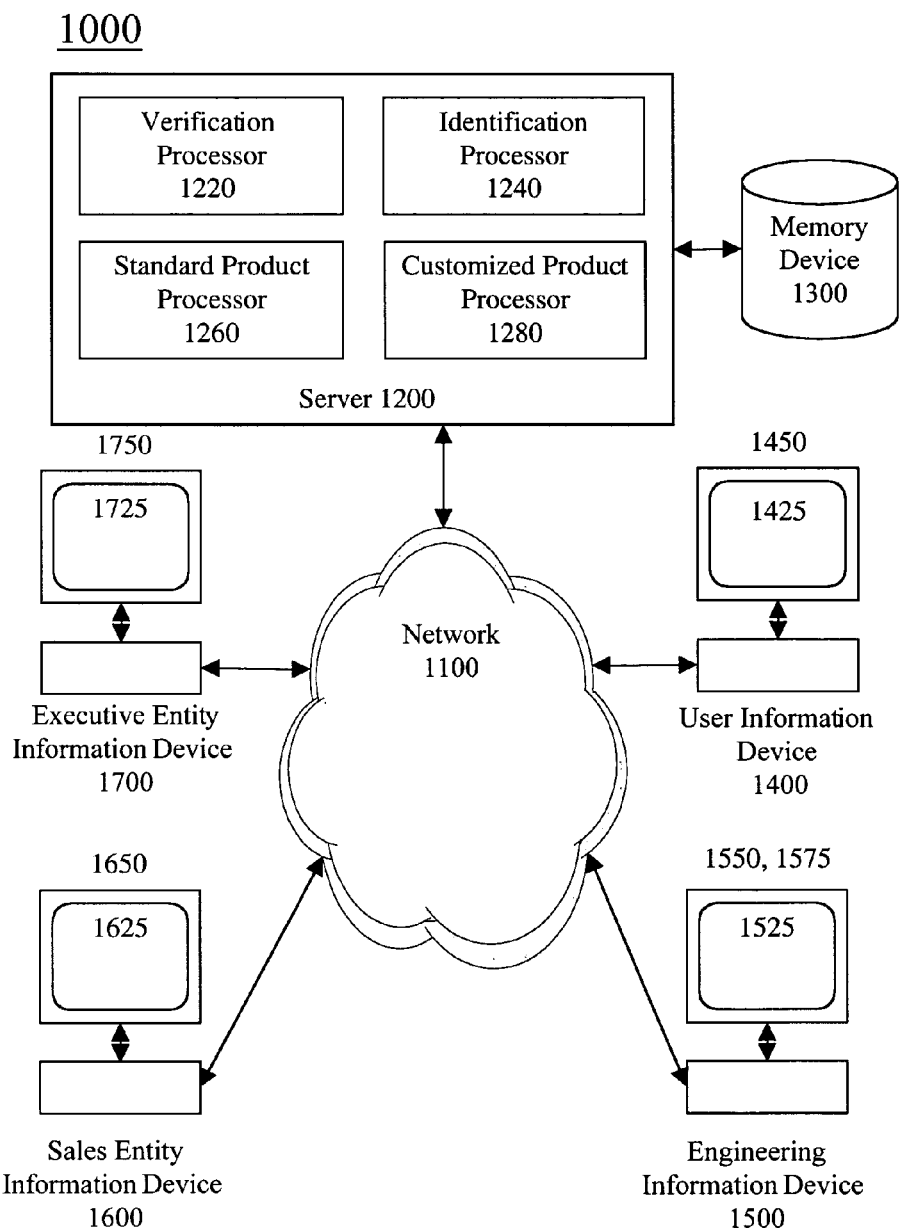
FIG. 1 is a block diagram of an exemplary embodiment of a product documentation and/or customization system 1000.

When the following terms are used herein, the accompanying definitions apply:

alternative—one or more selectable possibilities.

authenticate—to verify identify and/or grant authority and/or access.

automatic—performed via an information device in a manner essentially independent of influence or control by a user.

bill of materials—a list of components.

browser—a user-operable program adapted to access and render information via the Internet and/or another network.

can—is capable of, in at least some embodiments.

computer-assisted—performed utilizing an information device.

configuration—the manner in which parts and/or elements of a machine are arranged.

contemporaneous—within about 60, 30, 15, 10, 5, and/or 2, etc. seconds of an event.

customer—a potential purchaser of goods and/or services.

customer data sheet—a physical and/or electronic document providing information about a product.

customer's activity—actions taken by a customer.

customize—design, make, and/or modify according to a non-standard specification.

delivery—an act of transfer of possession of an item.

delivery time—an amount of time elapsed between an order and a transfer of possession of an item.

design—(n.) a purposeful arrangement of parts and/or details. The design of a product can comprise designing predetermined aspects of the product.

design—(v.) to plan in a manner that comprises the development of a graphic representation.

design parameter—a value for a design variable.

deviate—depart from a standard and/or norm.

digitized design file—an organized numerical representation comprising at least one graphic representation.

dimensioned drawing—a graphical representation comprising spatial measurements.

document—a physical and/or electronic collection of related data elements. If physical, a document comprises one or more sheets of paper and the related data elements printed thereon. A document can be a customer data sheet, engineering drawing, quotation, order, and/or invoice, etc.

electric motor—a motor powered by electricity. An electric motor can comprise two members, one stationary, called the stator, and the other rotating, called the rotor. Either member can utilize one or more magnets, electromagnets, and/or ferromagnetic components.

electronic—implemented on and/or via a computer and/or computer network.

engineering drawing—a drawing containing design information. Examples include a dimensioned drawing, one-line drawing, schematic, performance curve, flow sheet, block diagram, perspective view, illustration, photograph, etc.

engineering entity—a person and/or group of personnel responsible for performing design activities. An engineering entity can develop graphical representations of planned activities.

engineering module—software for performing design activities. An engineering module can develop graphical representations of planned activities.

identify—to recognize and/or detect.

information—data.

information device—any device capable of processing information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Handspring Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or or graphical user interface described herein may be used as an information device. An information device can include well-known components such as one or more network interfaces, one or more processors, one or more memories containing instructions, and/or one or more input/output (I/O) devices, one or more user interfaces, etc.

input—a signal, data, and/or information provided to a device and/or system.

Internet—a globally interconnected system of data networks.

manufacture—construct.

may—is allowed to, in at least some embodiments.

non-standard—not meeting an established criterion.

notify—to advise and/or remind.

order—contract to purchase and/or lease.

parameter—a variable.

performance curve—a graphical chart rendering information regarding operating characteristics of an electric motor. For example, performance curves can graphically display motor RPM vs. torque, current, and/or power factor, etc.

pre-approved—authorized in advance.

pre-determined set—an extent established in advance, which can include discrete values and/or ranges of values.

pre-determined set of alternatives—a plurality of values established in advance.

predetermined aspects—features established in advance.

processor—a hardware, firmware, and/or software machine and/or virtual machine comprising a set of machine-readable instructions adaptable to perform a specific task. A processor acts upon information by manipulating, analyzing, modifying, converting, transmitting the information to another processor or an information device, and/or routing the information to an output device.

program—plurality of machine-readable instructions.

prompt—to advise and/or remind.

quotation—a rendered offer to provide a good and/or a service at an indicated price.

recommend—advise.

real-time—substantially contemporaneous to a current time. For example, a real-time transmission of information can be initiated and/or completed within about 120, 60, 30, 15, 10, 5, and/or 2, etc. seconds of receiving a request for the information.

render—make perceptible to a human, for example as data, commands, text, graphics, audio, video, animation, and/or hyperlinks, etc., such as via any visual and/or audio means, such as via a display, a monitor, electric paper, an ocular implant, a speaker, a cochlear implant, etc.

report—an organized presentation.

request—a message asking for something.

sale—an exchange of goods or services for an amount of money or its equivalent.

sales entity—a person, group of personnel, and/or software adapted to facilitate customers in the purchase of goods and/or services.

schedule—a plan for performing work or achieving an objective.

specify—describe or characterize.

standard—one or more settled criterion.

user—any person, organization, process, device, program, protocol, and/or system that uses a device and/or service.

user interface—any device for rendering information to a user and/or requesting information from the user. A user interface includes at least one of textual, graphical, audio, video, animation, and/or haptic elements.

user interface element—This can be any known user interface structure, including for example, a window, title bar, panel, sheet, tab, drawer, matrix, table, form, calendar, outline view, frame, dialog box, static text, text box, list, pick list, pop-up list, pull-down list, menu, tool bar, dock, check box, radio button, hyperlink, browser, image, icon, button, control, dial, slider, scroll bar, cursor, status bar, stepper, and/or progress indicator etc.

validate—to establish the soundness of. For example, to compare an input against at least one standard.

value—a qualitative or quantitative measure of a parameter.

DETAILED DESCRIPTION

FIG. 1 is a block diagram of an exemplary embodiment of a product documentation and/or customization system 1000. System 1000 can comprise a network 1100. Network 1100 can be public, private, circuit-switched, packet-switched, connection-less, virtual, radio, telephone, POTS, non-POTS, PSTN, non-PSTN, cellular, cable, DSL, satellite, microwave, twisted pair, IEEE 802.03, Ethernet, token ring, local area, wide area, IP, Internet, intranet, wireless, Ultra Wide Band (UWB), Wi-Fi, BlueTooth, Airport, IEEE 802.11, IEEE 802.11a, IEEE 802.11b, IEEE 802.11g, X-10, and/or electrical power networks, etc., and/or any equivalents thereof. Network 1100 can be adapted to communicatively couple a plurality of information devices comprised by system 1000, which can be adapted for a user to request information, specify, order, and/or monitor an order status regarding a product.

System 1000 can comprise a server 1200, which can comprise a verification processor 1220, an identification processor 1240, a standard product processor 1260, and/or a customized product processor 1280, etc. Verification processor 1220 can be adapted to pre-approve and/or authenticate a user. The user can be authenticated responsive to information, such as a username and/or a password, provided by the user via, for example an Internet browser based user interface.

Identification processor 1240 can, responsive to a user request for product information, identify a product. Identification processor 1240 can prompt the user to provide information related to the requested product. In certain exemplary embodiments, identification processor 1240 can present at least two alternative products to the user. Identification processor 1240 can identify the product based on a value for each of one, a plurality, and/or all parameters provided by the user.

Standard product processor 1260 can be adapted to determine if a standard product corresponds to the identified product and/or if each value for a parameter provided by the user is within a predetermined set associated with each parameter. If the standard product corresponds to the identified product, and/or if each value for a parameter provided by the user is within a predetermined set associated with each value for a parameter, standard product processor 1260 can be adapted to automatically generate and/or retrieve a design for at least certain aspects of the product. Standard product processor 1260 can initiate transmission of at least one document related to the product to the user in real-time. The document transmission can be initiated automatically and/or electronically.

Customized processor 1280 can be adapted to determine when no standard product corresponds to the identified product, and take any of a number of actions. For example, when no standard product corresponds to the identified product, customized processor 1280 can provide at least one suggestion to the user for a suggested value for each of one or more user-provided parameters. As another example, customized processor 1280 can suggest a product that meets some, but not all, of the values of the user-provided parameters. As yet another example, the customized processor 1280 can electronically forward the request for product information from the user to an engineering entity and/or engineering module, for design of a product that does conform, if possible, to the values of the user-provided parameters. Customized processor 1280 can electronically initiate transmission of a document related to a customized product to the user.

Server 1200 can be communicatively coupled to a memory device 1300. Memory device 1300 can be adapted to store information identifying the user such as a moniker, username, avatar, alias, password, digital certificate, public key, corporate affiliation, and/or address, etc. Memory device 1300 can be adapted to store information related to the product such as, for example, a list of standard products, a plurality of constraints and/or rules for validating an input and/or configuration provided by the user, and/or a plurality of design calculations and/or design procedures for designing a product responsive to the user input and/or configuration. Memory device 1300 can store data, such as information, constraints, rules, procedures, forms, inputs, configurations, etc., in a format compatible with a data storage standard such as Knowledge Builder, SQL Server, MySQL, Microsoft Access, Oracle, FileMaker, Excel, SYLK, ASCII, Sybase, XML, and/or DB2, etc.

System 1000 can comprise a user information device 1400. In certain exemplary embodiments, a user can be a customer. User information device 1400 can comprise a user program 1450 such as an Internet browser. User information device 1400 can comprise a user interface 1425. Utilizing the user program, via the user interface, a user can communicate, provide, and/or receive information related to the specification, pricing, and/or purchase of a product. In certain exemplary embodiments, the product can be any automatically and/or customizably designable product, apparatus, device, machine, and/or system, such as an electrical (e.g., electric motor, switch, starter, breaker, surge protector, transformer, etc.), mechanical (e.g., pump, fan, coil, heat exchanger, compressor, damper, hood, glovebox, clean room, mixer, mill, machine, engine, transmission, gearbox, coupling, automobile, truck, propelled machine, etc.), and/or information (personal computer, server, laptop, PDA, cell phone, etc.), product, apparatus, device, machine, and/or system.

The product information can be communicated and/or provided to at least one other information device communicatively coupled to network 1100. For example, system 1000 can comprise an engineering information device 1500. Engineering information device 1500 can comprise a first engineering program 1550 and/or a user interface 1525 adapted to notify an engineering entity and/or engineering module of a request from the user. If the request from the user relates to a standard product and/or each value for a design parameter provided by the user is within a predetermined set, the engineering module can automatically custom design the product.

If the request from the user includes one or more design parameters not within a pre-determined set for a product, and/or relates to a customizable product, engineering information device 1500 can provide, and/or notify the engineering entity and/or engineering module to provide, a design for a product. Engineering information device 1500 can comprise a second engineering program 1575 adapted to assist the engineering entity and/or engineering module with computer-aided design related to the product. Engineering information device 1500 can be adapted to provide a document to, for example, server 1200. The document can be provided electronically to the user via, for example, user information device 1400.

System 1000 can comprise a sales entity information device 1600. Sales entity information device 1600 can comprise a sales entity program 1650 and/or a user interface 1625 adapted to notify a sales entity of activities of a user. Activities of a user can comprise requesting authentication via server 1200, requesting product information, requesting a quotation for the product, ordering the product, checking a manufacturing schedule related to the product, and/or checking a delivery activity relating to the product, etc.

System 1000 can comprise an executive entity information device 1700. Executive entity information device 1700 can comprise an executive entity program 1750 and/or a user interface 1725 adapted to notify an executive entity of activities relating to product purchasing, engineering, sales, manufacturing, and/or delivery, etc. Executive entity information device can be adapted to provide summary information from at least one of a quotation system, an ordering system, an engineering system, a sales management system, a materials management system, a manufacturing management system, and/or a customer service system, etc.

For example, executive entity information device 1700 can be adapted to render information relating to the activities of an engineering entity and/or engineering module relating to the product. Executive entity information device 1700 can allow an executive entity to modify a design, examine a bill of materials, and/or reschedule manufacturing of the product, etc. Executive entity information device 1700 can be adapted to automatically detect and render information relating to an exceptional condition based upon at least one comparison of actual performance to a predetermined threshold.

Executive entity information device 1700 can render information adapted to provide information relating to dynamically changing product features. Executive entity information device 1700 can be adapted to keep an executive entity current regarding product changes and/or developments. Executive entity information device 1700 can be adapted to provide and/or render forecasts and/or budgeting information. Forecasts and/or budgeting information can be based in any currency such as U.S. Dollars, Euros, British Pounds, Swiss Francs and/or Japanese Yen, etc.

Executive entity information device 1700 can be adapted to compile information regarding sales and/or marketing efficiency and/or effectiveness. Information regarding sales and/or marketing efficiency and/or effectiveness can be determined responsive to a plurality of user requests via information devices such as user information device 1400.

Executive entity information device 1700 can be adapted to provide information technology administration for system 1000. The executive entity can maintain and/or upgrade a plurality of machine readable instructions adapted to design and/or customize products. For example, the executive entity can provide rules associated with limiting a choice of at least one parameter related to the product. The executive entity can provide instructions to automatically provide reports responsive to predetermined rules. Executive entity information device 1700 can be adapted to provide instructions determining the structure of a database related to the product stored on, for example, memory device 1300 via server 1200. Information device 1700 can be adapted to maintain, synchronize, and/or provide reports regarding information associated with products associated with system 1000.

Executive entity information device 1700 can be adapted to provide forecasts related to sales, manufacturing, and/or delivery of products. Forecasts can be used to predict resource requirements and/or financial results related to providing products in a marketplace.

Figure 2:
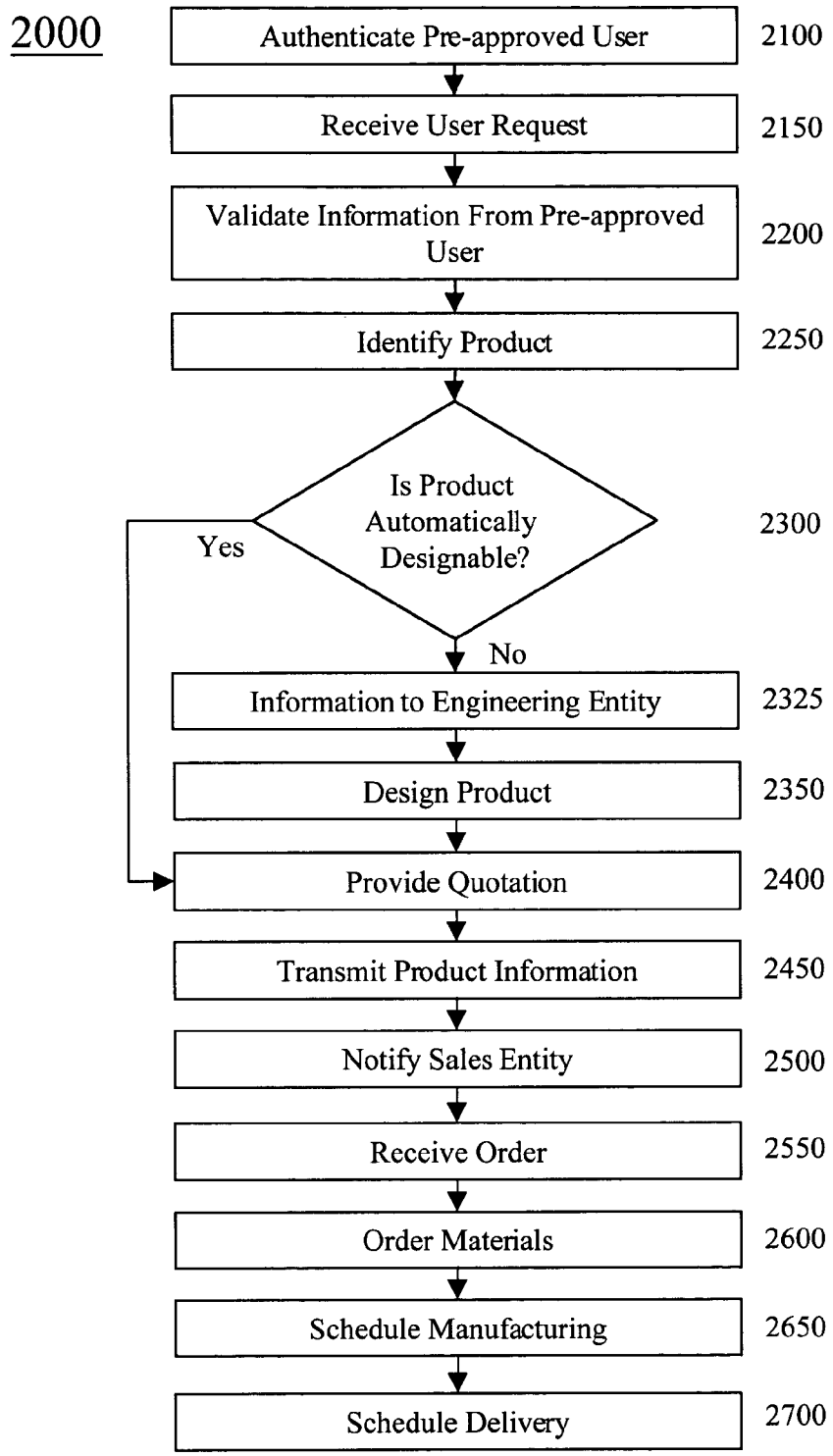
FIG. 2 is a flow diagram of an exemplary embodiment of a product customization method 2000.

FIG. 2 is a block diagram of an exemplary embodiment of a product customization method 2000. At activity 2100 a user can be authenticated. In certain exemplary embodiment, the user can be pre-approved by meeting at least one threshold established by an organization providing a product. The authentication can be automatic responsive to, for example, a login process wherein the user provides a user identification and a user password. The user can provide information for authentication via, for example, an Internet browser. In certain exemplary embodiments, the user can be provided with a proprietary URL, and/or communications address to request and/or access product information.

At activity 2150, a user request can be received. The user request can be a request to identify the product, a request for quotation for the product, and/or an order for the product, etc. The user request can comprise a value for at least one parameter provided by the user relating to the product. The at least one parameter can be a design parameter. For example, wherein the product is an electric motor, parameters can comprise a power rating, motor frame, speed, percent starting voltage, full load speed, full load current, locked rotor current, full load torque, starting torque, breakdown torque, efficiency, power factor, safe stalled time, acceleration time, motor core length, rotor type (e.g. aluminum die cast), rotor construction, operating altitude, ambient temperature, bearing type, bearing lubrication type, electric power frequency, number of electrical phases, class, group, division, load inertia, rotor inertia, rotor weight, motor weight, inrush power limit, service factor, temperature rise, noise emission level, thrust rating, variable frequency drive, voltage, winding type, enclosure type, and/or count of motors, etc. In certain exemplary embodiments, the user can select a value for a parameter from a predetermined set of values for the parameter. The predetermined set of values for a second parameter can be determined responsive to the user selecting a value for a first parameter. That is, the predetermined set of values for any parameter can be determined responsive to user-selected values for one or more other parameters. As an example, if a user has specified a horsepower of 10, frame sizes that are only reasonable for much larger horsepower motors can be excluded from a provided list (or other form of user interface element) of potential frame sizes from which the user can choose. In certain exemplary embodiments, the user can provide a predetermined configuration for the product, that configuration representative of a plurality of values for parameters related to the product.

At activity 2200, information from the user and/or an information device can be validated, such as via comparing the information to at least one predetermined standard, a list of pre-established valid entries, and/or a list of pre-established valid configurations for the product. For example, to validate values for design parameters associated with an electric motor, information such as: motor load, ambient temperature, altitude, service factor, temperature rise, resistance temperature detector presence, motor speed, bearing type, variable frequency drive speed range, variable frequency drive load type, variable frequency drive inverter type, vertical thrust load, hazardous location class, hazardous location group, and/or hazardous location division, etc., can be compared to at least one predetermined standard, a list of pre-established valid entries, and/or a list of pre-established valid configurations for the electric motor. As another example, if the product is an electric motor, a service factor provided by a user can be compared against a set of pre-established valid service factors.

At activity 2250, the product can be identified. The product can be identified responsive to information provided by the user. The product can correspond to at least one value for a parameter, a plurality values for parameters, and/or all values for parameters provided by the user. In certain exemplary embodiments at least two alternative products can be provided to the user. In certain exemplary embodiments, the user can provide information indicative of a selection of an alternative custom product.

At activity 2300, a determination can be made whether the product is automatically designable. In certain exemplary embodiments, the product can be automatically designable when the product is a standard product. In certain exemplary embodiments, the product can be automatically designable when user-provided values for parameters are each within a corresponding pre-determined set of parameter values. The automatically designable product can be one of a plurality of products that can be manufactured and/or supplied. The automatically designable product can comprise a plurality of pre-established qualities and/or characteristics, such as materials of construction, part identifications, part quantities, assembly procedures, etc. A design for an automatically designable product can be automatically determined and/or performed in real-time with respect to the user request. The design for the automatically designable product can be automatically provided by an engineering module.

At activity 2325, if the product is not automatically designable, information can be provided to an engineering entity. Information provided to the engineering entity can comprise the user-provided values for the design parameters. At least one of those user-provided values can be outside and/or inconsistent with a predetermined set of values associated with the corresponding parameter.

At activity 2350, the product can be designed. The engineering entity and/or engineering module can provide a customized design for the product responsive to the user-provided values for the design parameters. The design of the product can comprise designing predetermined aspects of the product responsive to at least one value for a design parameter provided by the user.

For example, if the product is an electric motor, the engineering entity and/or engineering module can determine that predetermined aspects comprise at least one rotor core, stator core, stator coil, stator assembly, rotor shaft, machine enclosure, machine frame, terminal box, and/or bearing, etc. Given a particular and/or user-provided electric motor horsepower, voltage, and frequency; the engineering entity and/or engineering module can determine winding specifications for the stator assembly. The winding specifications can be determined based on classic, standard, and/or non-standard engineering calculations and/or equations involving flux densities. The winding design can be checked for manufacturability. A temperature rise and/or performance characteristic can be checked based on minimum standard values and/or customer specifications. The motor winding, stator, and/or rotor core can be modified to meet predetermined and/or minimum acceptable values and/or user-provided values. Once a size of a frame associated with the electric motor is determined, a mechanical design process performed by the engineering entity and/or engineering module can determine a bearing size, a shaft size, and/or a proper enclosure, etc., followed by an identification of specific manufacturers, models, brands, types, part numbers, and/or SKU's, etc., associated with the determined mechanical components. The engineering entity and/or engineering module can develop at least one bill of materials, parts list, data sheet, and/or engineering drawing, etc., responsive to and/or consistent with the design.

The engineering entity and/or engineering module can electronically communicate a document related to the product to the user, a sales entity, a purchasing entity, and/or an executive entity, etc. The engineering entity and/or engineering module can provide user accessible information related to a requested product customization, value, and/or parameter, etc. In certain exemplary embodiments, the engineering entity and/or engineering module can provide the user with electronically transmitted information indicative of a price adder associated with a requested customization, value, and/or parameter, etc. The engineering entity and/or engineering module can be provided with a menu selectable choice of communications destinations related to a customization, value, and/or parameter, etc., associated with the product. For example, the engineering entity and/or engineering module can electronically communicate information to the user, the sales entity, a purchasing entity, a manufacturing entity, and/or an executive entity, etc. The engineering entity and/or engineering module can electronically update documents responsive to design parameter value changes. Certain exemplary embodiments can update documents via dragging and dropping components comprised in the documents. Documents can be adapted to dynamically update a bill of materials associated with the product.

At activity 2400, a quotation for the product can be provided to the user. The quotation can be responsive to the user requesting a quotation. The quotation can be provided to the user automatically and/or electronically. The quotation can, for example, be rendered on an Internet browser and/or a plug-in thereto; faxed; downloaded; transferred, provided as an e-mail text message, attachment, etc.; and/or provided as a chat and/or instant message; etc. The quotation can be provided in any of a plurality of standard formats such as, for example, ASCII, PDF, TIFF, HTML, XML, RTF, Microsoft Word, and/or Word Perfect, etc. The quotation can be dynamically updatable responsive to a change in at least one design parameter value. The quotation can comprise information such as terms and conditions associated with the quotation and/or warranty information regarding the product. The quotation can be provided according to a predetermined and/or a dynamically updatable template.

At activity 2450, product information can be transmitted. Product information can comprise at least one document such as an engineering drawing of a standard and/or customized product, information indicative of performance, and/or a customer data sheet, etc. The at least one engineering drawing can comprise dimensions. The information indicative of performance can be rendered via a performance curve. The customer data sheet can comprise quantitative and/or qualitative descriptive information regarding the product. For example, the customer data sheet can describe size information, performance information, and/or information regarding the appearance, handling, shipping, installation, operation, maintenance, etc., of the product. Product information can be transferred in approximately real-time to the user. Product information can be provided to the user via an automatically initiated transmission.

At activity 2500, a sales entity can be notified regarding user activity. The sales entity can be notified, for example, of a user logging in to a product website, a user requesting a quotation of the product, and/or a user ordering the product, etc. The sales entity can be notified regarding a single user request and/or a plurality of user requests. The sales entity can be notified automatically, for example, via an Internet browser, e-mail message, instant message, fax, pager message, voice-mail, etc. The sales entity can act responsive to the notification. The sales entity can contact the user to monitor a satisfaction level of the user, request additional information, and/or undertake activities of a promotional nature. The sales entity can monitor activities in the organization and communicate with the user in order to improve user satisfaction.

Certain exemplary embodiments can comprise a sales information system adapted to generate product sales proposals and/or provide information for supporting a sales proposal. The sales information system can comprise an automated process requiring manual intervention only on an exception basis for customized product requests. The sales information system can generate a customer proposal packet (e.g., proposal, drawings, performance curves, and/or data sheets, etc.) in real-time relative to a request for product information.

The sales information system can provide auditing and tracking capabilities of the user request for product information and activities pursuant to the user request. The sales information system can comprise customer account management, customer and quotation tracking, and/or access to templates for pre-configured quotations/proposals, etc.

The sales information system can provide information to the sales entity to allow the sales entity to contact the user. The user contact can be direct via phone, fax instant message, voicemail, and/or email, etc.; and/or through a third party representative acting in behalf of the sales entity. The contact can be responsive to the quotation provided to the user if the user has not ordered the product within a predetermined time period. The sales information system can automatically prompt the sales entity to contact a particular customer regarding a particular product quotation and/or purchase. The sales entity can contact a customer pursuant to a customized product request. The sales entity can review the design and/or the quotation to ascertain whether additional information should be provided to the customer. The sales entity can be automatically prompted to reward a customer responsive to at least one purchasing decision of the customer.

At activity 2550, an order can be received from the user. The order can be received, for example, via a user input to an Internet browser. The order can comprise a reference to the quotation and/or the identified product. The order can comprise information indicative of a desired and/or expected delivery date for the product. Responsive to the order, the user can be prompted to approve at least one document related to the product such as an engineering drawing. The user can request specific performance data related to the product, an acceptance testing protocol related to the product, and/or terms and conditions incident to the purchase of the product desired by the user, etc. Certain exemplary embodiments can be adapted to provide the user with information related to the order such as design parameter values, order status, terms, conditions, a manufacturing schedule, and/or a shipment schedule, etc.

At activity 2600, materials can be ordered responsive to the order received from the user. Materials can be ordered automatically from a bill of materials associated with the product. The bill of materials can be dynamically updated pursuant to an automatic and/or electronic design of the product. Materials deliveries can be scheduled and/or estimated in order to verify, project, and/or refute an ability to meet a desired delivery date for the product.

At activity 2650, a schedule can be made for manufacturing the product. The schedule can be responsive to the user's desired and/or expected delivery date, materials deliveries, and/or known or estimated schedules for manufacturing products for other users. In certain exemplary embodiment embodiments the schedule for manufacturing the product can be electronically communicated to the user.

At activity 2700 a schedule can be made for delivery of the product. The schedule for delivery of the product can be made responsive to the manufacturing schedule for the product. In certain exemplary embodiments the schedule for manufacturing the product can be electronically communicated to the user.

Figure 3:
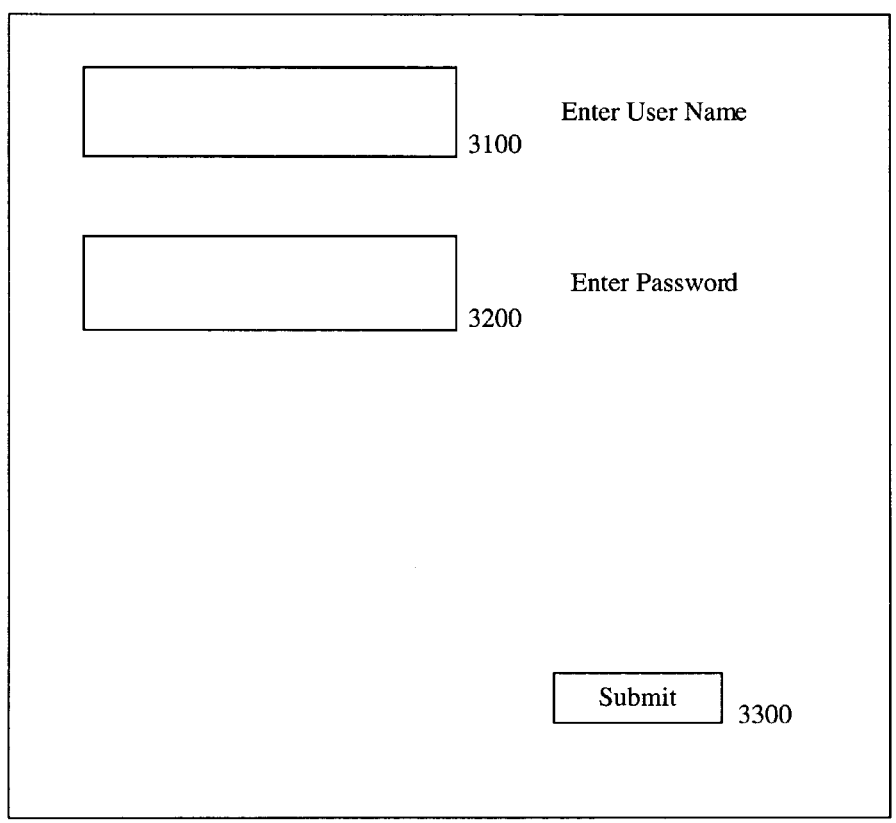
FIG. 3 is a block diagram of an exemplary embodiment of a user interface 3000.

FIG. 3 is a block diagram of an exemplary embodiment of a user interface 3000. User interface 3000 can comprise an authentication element comprising fields for a user to provide identification information such as a first field 3100. First field 3100 can be adapted to receive an identification, such as a name, username, alias, and/or moniker, etc., of a user. User interface 3000 can comprise a second field 3200. Second field 3200 can be adapted to receive a pre-established password and/or key associated with the identification of the user. A combination of a user identification and password can provide a pre-approved user with authorized access to resources associated with an information device. User interface 3000 can comprise a submit button 3300. Submit button 3300 can, pursuant to user activation, be adapted to electronically transmit information comprised in first field 3100 and/or second field 3200 to an information device adapted to provide the pre-approved user with access to resources responsive to a successful authentication of the user's identity.

FIG. 4 is a block diagram of an exemplary embodiment of a user interface 4000. User interface 4000 can comprise a plurality of page tabs 4100 such as tabs functionally related to specification, attributes, design goals, and/or modifications relating to a product. Page tabs 4100 comprised in user interface 4000 can be adapted to provide a user with a plurality of related user interfaces and/or user interface elements for entering and/or viewing information regarding a product. For example, the modification tab of page tabs 4100 can be adapted to receive information indicative of a customized product and/or a product with at least one design parameter value related to the electric motor not within a pre-determined set for that design parameter. An entry under the modifications tab can preclude an automatic design of the product and result in an automatic transmission of information related to the product to an engineering entity and/or engineering module. For example, if the product is an electric motor, the user can provide information under the modifications tab of a special bearing request for the electric motor.

User interface 4000 can comprise a data entry element comprising a first field 4200. First field 4200 can be adapted to receive a user input indicative of a name and/or moniker associated with a product for which the user is requesting information. For example, first field 4200 can receive a numeric and/or alphanumeric name associated with the product.

User interface 4000 can comprise a second field 4300. Second field 4300 can be adapted to receive information indicative of a capability of the product. For example, wherein the product is an electric motor, second field 4300 can receive an input indicative of the horsepower or kilowatt rating associated with the motor. For example, the user can select a horsepower value such as 0.5, 0.75, 1.0, 5, 10, 20, 50, 100, 200, 500, 1000, and/or 5000, potentially along with all other manufacturable horsepower ratings above, below, and/or in between these exemplary values. Certain exemplary embodiments can comprise a pull down menu to select one of a predetermined list of values for second field 4300.

User interface 4000 can comprise a third field 4400. Third field 4400 can be adapted to receive a performance related value associated with the product. For example, wherein the product is an electric motor, third field 4400 can comprise information related to a desired rotational speed of a shaft. The rotational speed in rpm can be, for example, 600, 1200, 1800, 3600, or 7200, potentially along with all other manufacturable speed ratings above, below, and/or in between these exemplary values. Certain exemplary embodiments can comprise a pull down menu to select one of a predetermined list of values for third field 4400. The predetermined list of values can be provided and/or limited responsive to information previously provided by the user such as, for example, a product power rating.

User interface 4000 can comprise a fourth field 4500. Fourth field 4500 can be adapted to receive an energy related value associated with the product. For example, wherein the product is an electric motor, fourth field 4500 can comprise information related to a designed power input rating of the electric motor. The voltage in volts can be, for example, 115, 230, 460, 2300, or 4600, potentially along with all other manufacturable voltage above, below, and/or in between these exemplary values. Certain exemplary embodiments can comprise, for example, a pull down menu to select one of a predetermined list of values for fourth field 4500. The predetermined list of values can be provided and/or limited responsive to information previously provided by the user such as, for example, a product power rating and/or speed.

User interface 4000 can comprise a document request element such as submit control button 4600. Submit control button 4600 can, pursuant to user activation, be adapted to electronically transmit information comprised in first field 4200, second field 4300, third field 4400, and/or fourth field 4500 to an information device adapted to receive information from and provide information to the pre-approved user related to the product.

Figure 5:
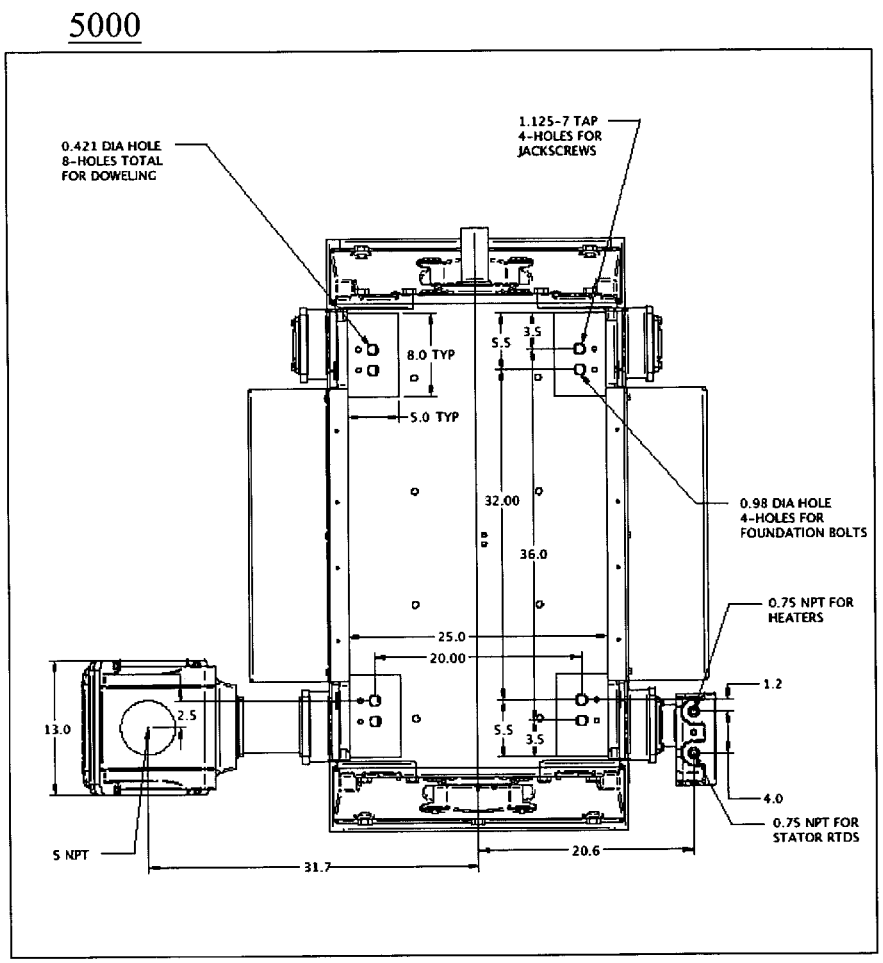
FIG. 5 is an exemplary embodiment of a document 5000.

FIG. 5 is an exemplary embodiment of a document 5000. In the embodiment shown in FIG. 5, document 5000 is a dimensioned drawing of an electric motor. The dimensioned drawing can provide the user with information relating to planning for use of the product. For example, in the case of the electric motor, the user can prepare a foundation, prepare an electric power supply, and/or purchase power transmission equipment to couple the shaft of the electric motor to a driven device, etc. In certain exemplary embodiments, document 5000 can be a dimensioned drawing of a standard and/or customized electric motor that was automatically drafted by the engineering module.

Figure 6:
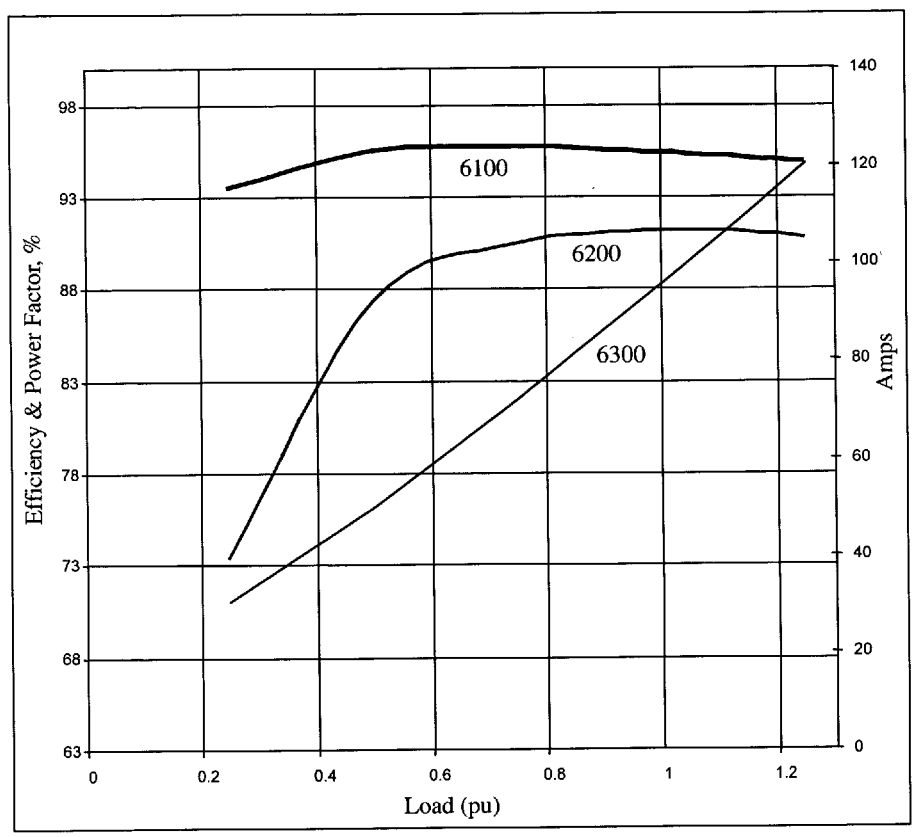
FIG. 6 is an exemplary embodiment of a document 6000.

FIG. 6 is an exemplary embodiment of a document 6000. In the embodiment shown in FIG. 6, document 6000 is a set of performance curves related to an electric motor. Performance curves related to the electric motor can comprise an efficiency curve 6100. Efficiency curve 6100 can provide a user with information related to an expected efficiency of the electric motor as a function of load applied to the electric motor. Efficiency curve 6100 can provide a user with information indicative of an effective or useful output of mechanical energy to the total input of electrical energy of the electric motor.

Document 6000 can comprise a power factor curve 6200. Power factor curve 6200 can provide a user with information related to an expected power factor of the electric motor as a function of load applied to the electric motor. Power factor curve 6200 can provide information indicative of an expected effect of the motor on a phase angle between a voltage and a current of a power supply to the electric motor.

Document 6000 can comprise an electrical current curve 6300. Electrical current curve 6300 can provide a user with information related to an expected electric current draw as a function of load applied to the motor. Knowing the expected current draw as a function of load can provide the user with information to predict an electrical power cost associated with using the electric motor.

Figure 7:
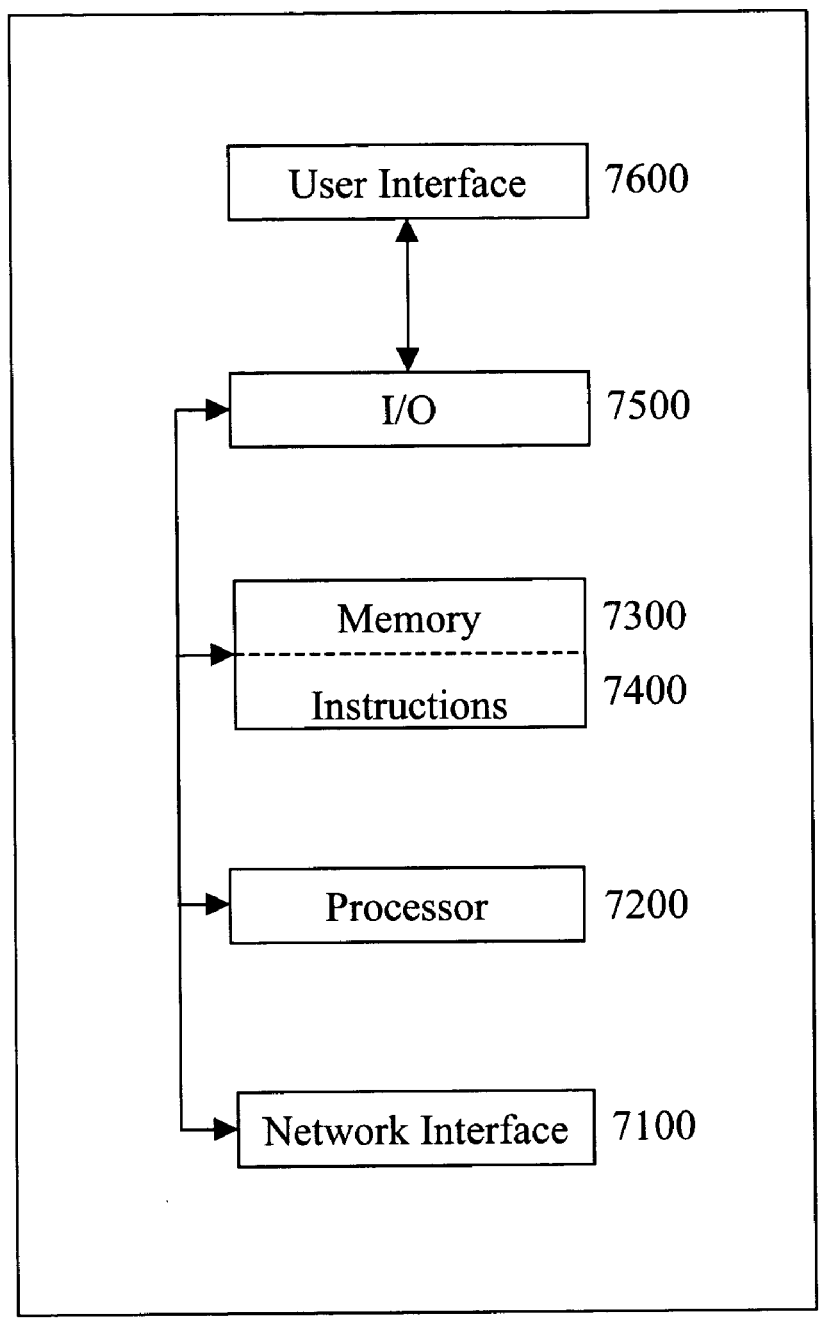
FIG. 7 is a block diagram of an exemplary embodiment of an information device 7000.

FIG. 7 is a block diagram of an exemplary embodiment of an information device 7000, which in certain operative embodiments can comprise, for example, server 1200, user information device 1400, engineering information device 1500, sales entity information device 1600, and/or executive entity information device 1700 of FIG. 1. Information device 7000 can comprise any of numerous well-known components, such as for example, one or more network interfaces 7100, one or more processors 7200, one or more memories 7300 containing instructions 7400, one or more input/output (I/O) devices 7500, and/or one or more user interfaces 7600 coupled to I/O device 7500, etc.

In certain exemplary embodiments, via one or more user interfaces 7600, such as a graphical user interface, a user can view a rendering of information related to specifying, ordering, designing, selling, manufacturing, and/or delivering a product such as an electric motor.

Figure 8:
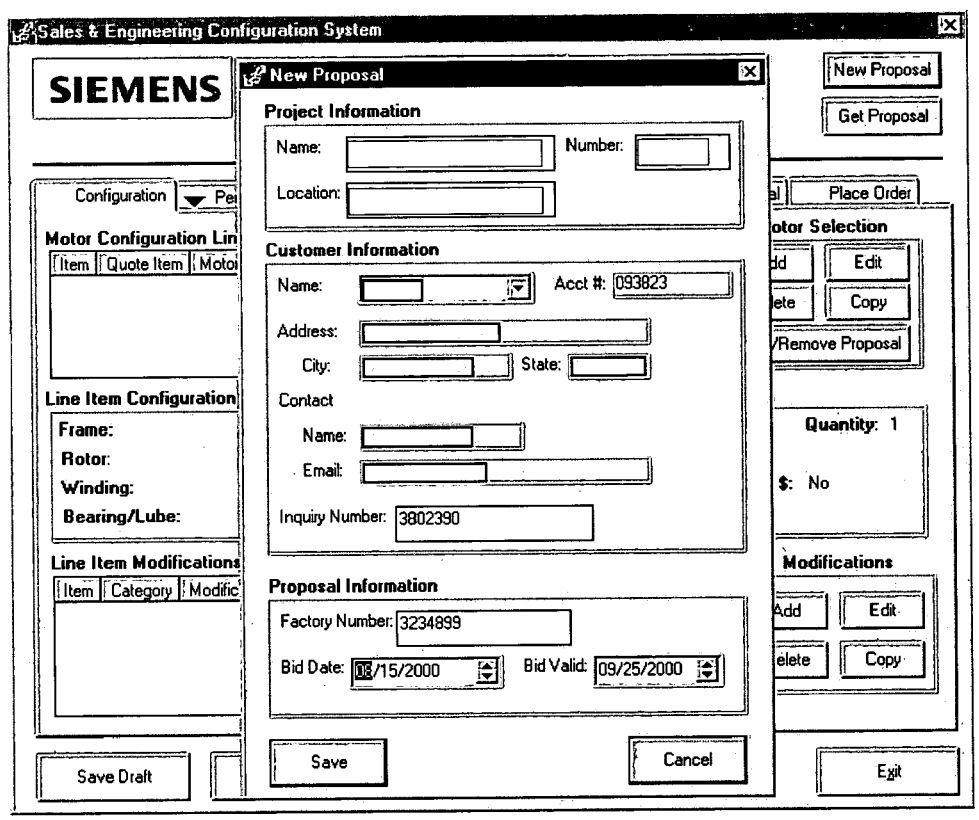
FIG. 8 is an exemplary user interface for initiating a new proposal.

FIG. 8 is an exemplary user interface for initiating a new proposal.

Figure 9:
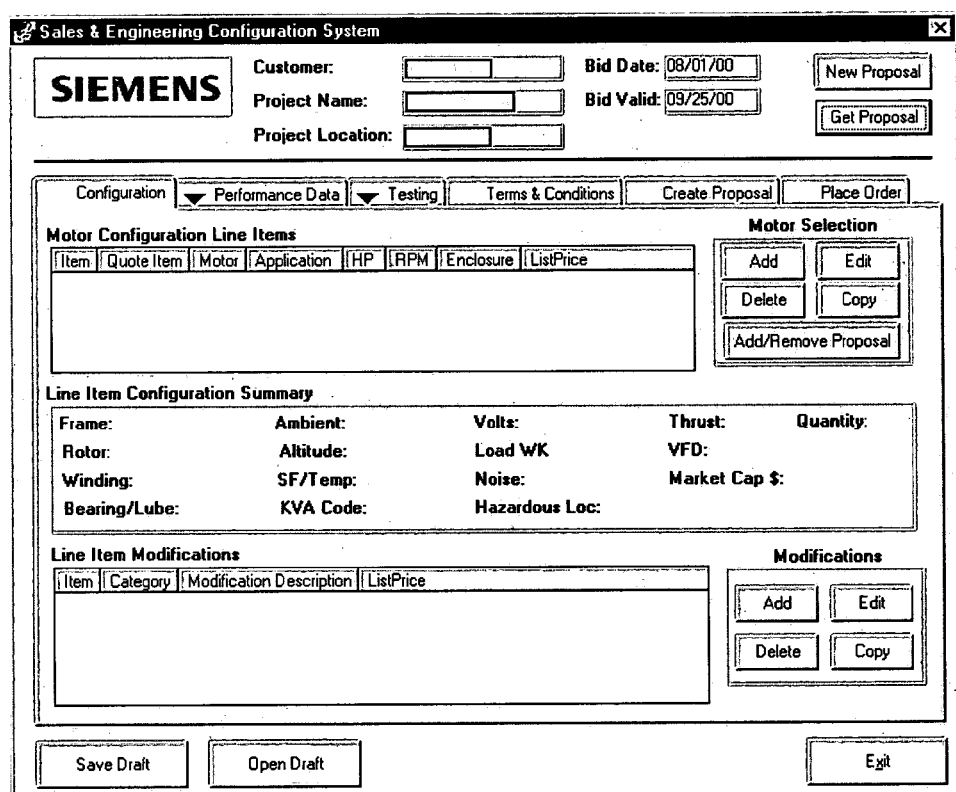
FIG. 9 is an exemplary user interface for entering a motor configuration.

FIG. 9 is an exemplary user interface for entering a motor configuration.

Figure 10:
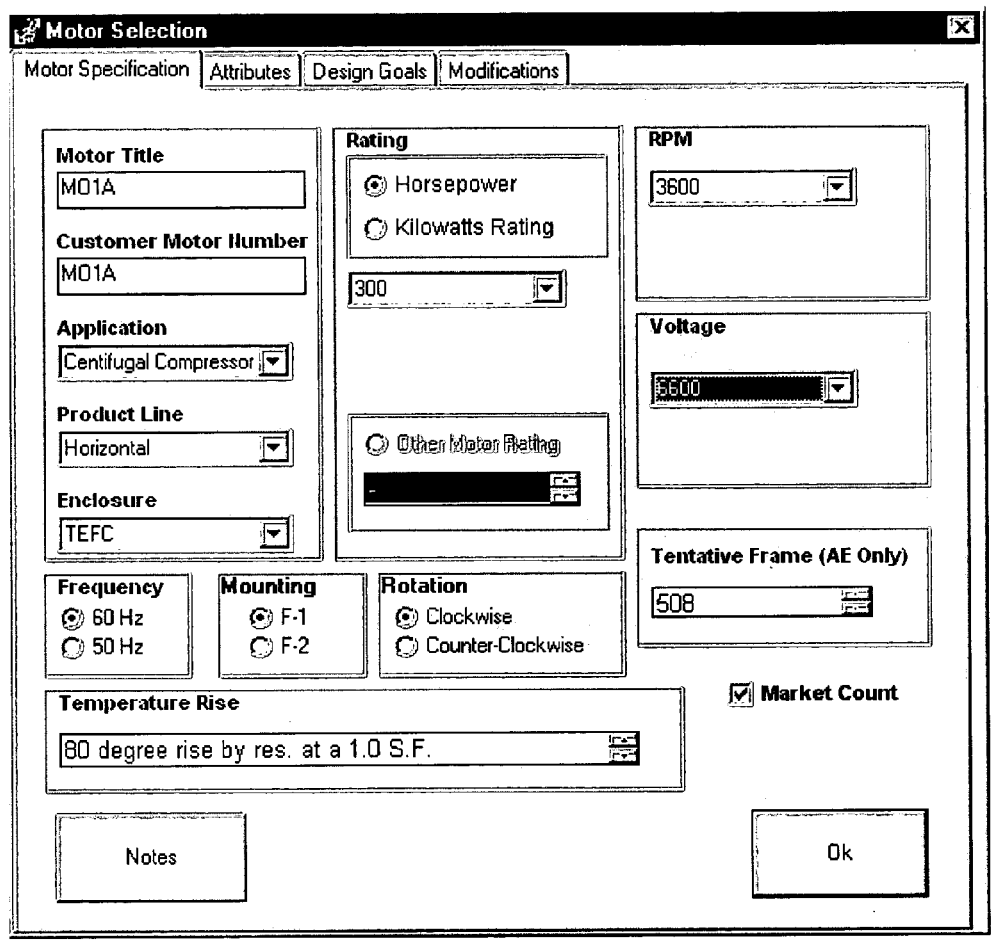
FIG. 10 is an exemplary user interface for entering values for certain motor parameters.

FIG. 10 is an exemplary user interface for entering values for certain motor parameters.

Figure 11:
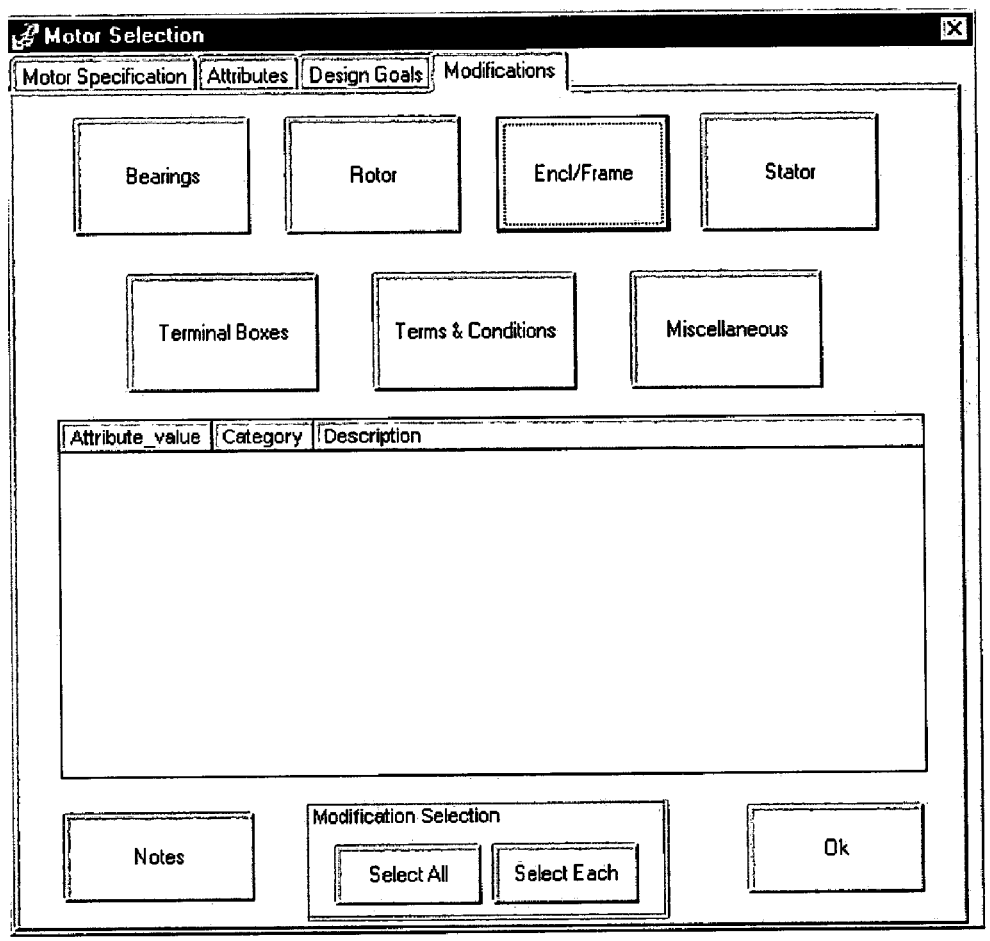
FIG. 11 is an exemplary user interface for selecting certain motor subsystems.

FIG. 11 is an exemplary user interface for selecting certain motor subsystems.

Figure 12:
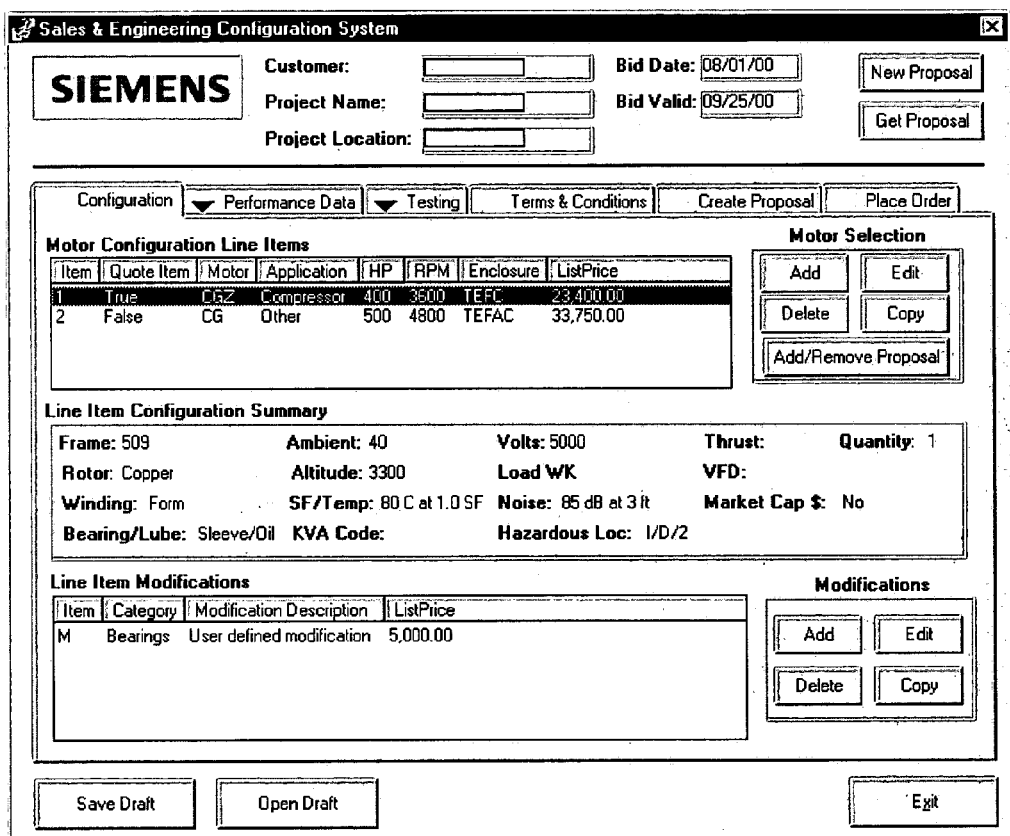
FIG. 12 is an exemplary user interface for viewing an overview of a configuration.

FIG. 12 is an exemplary user interface for viewing an overview of a configuration.

Figure 13:
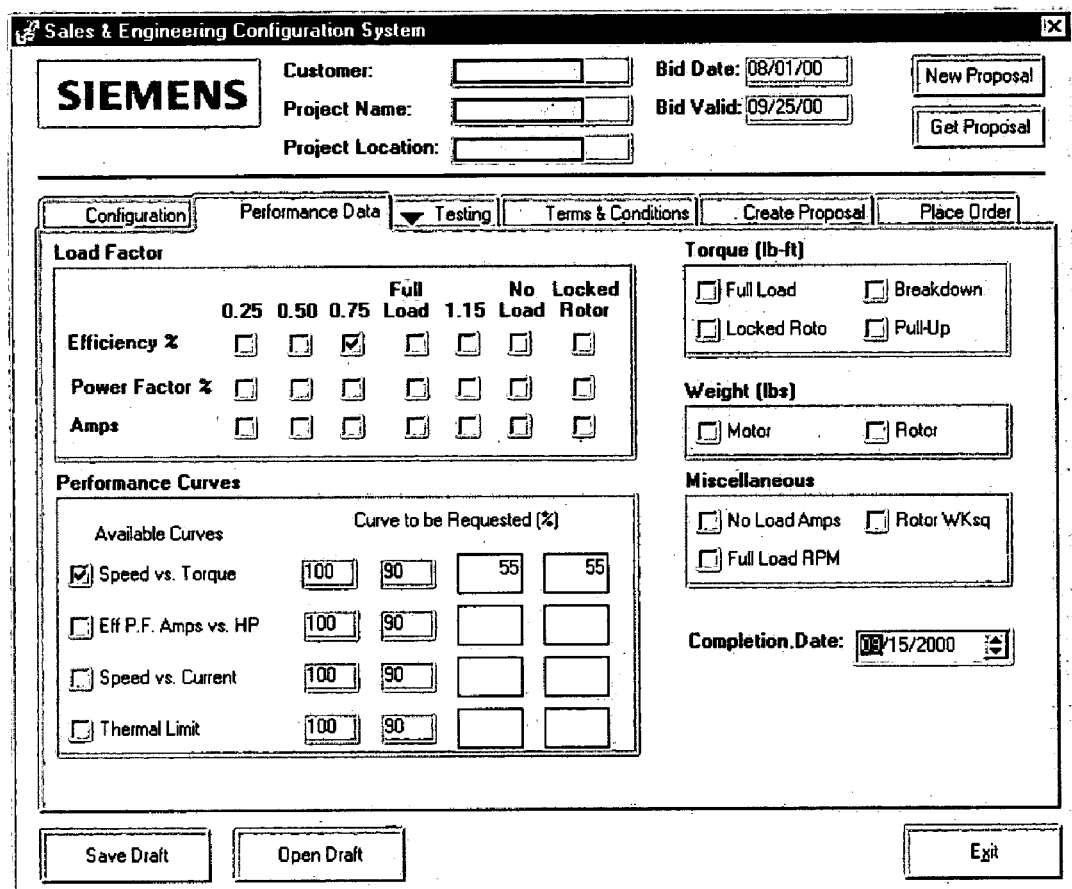
FIG. 13 is an exemplary user interface for requesting performance data.

FIG. 13 is an exemplary user interface for requesting performance data.

Figure 14:
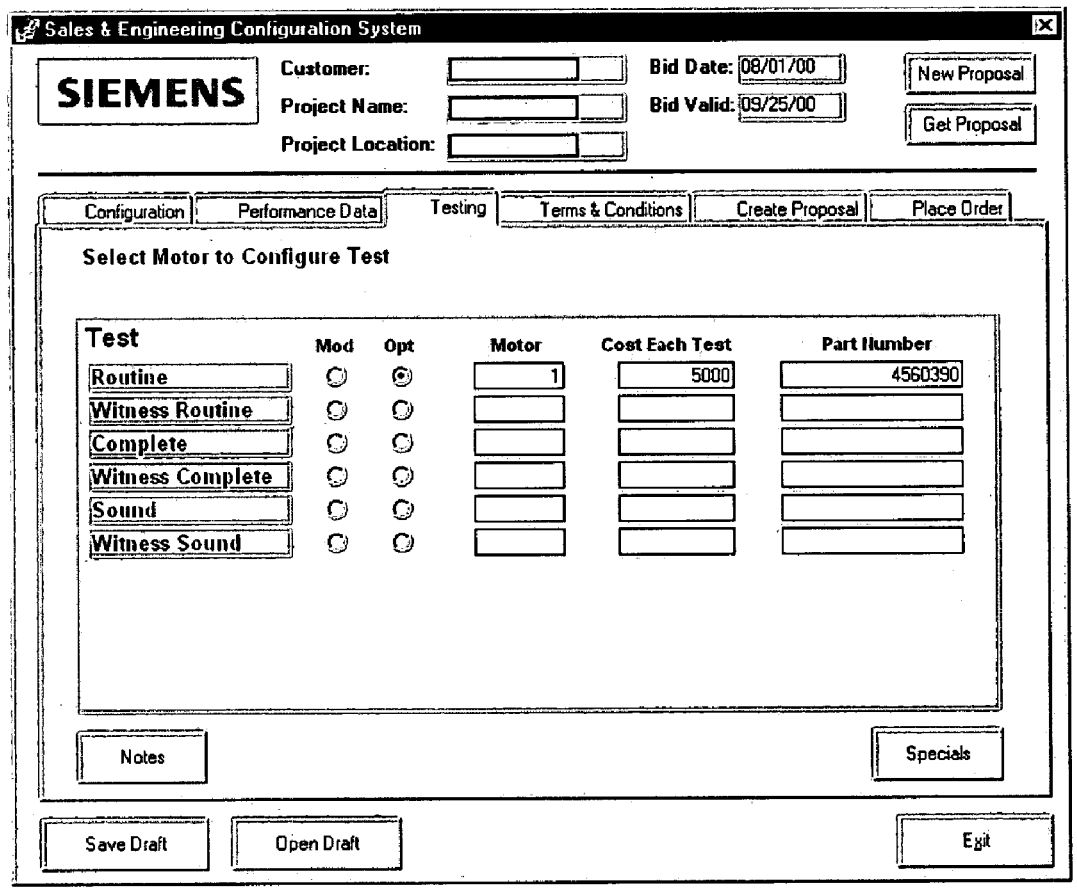
FIG. 14 is an exemplary user interface for requesting testing.

FIG. 14 is an exemplary user interface for requesting testing.

Figure 15:
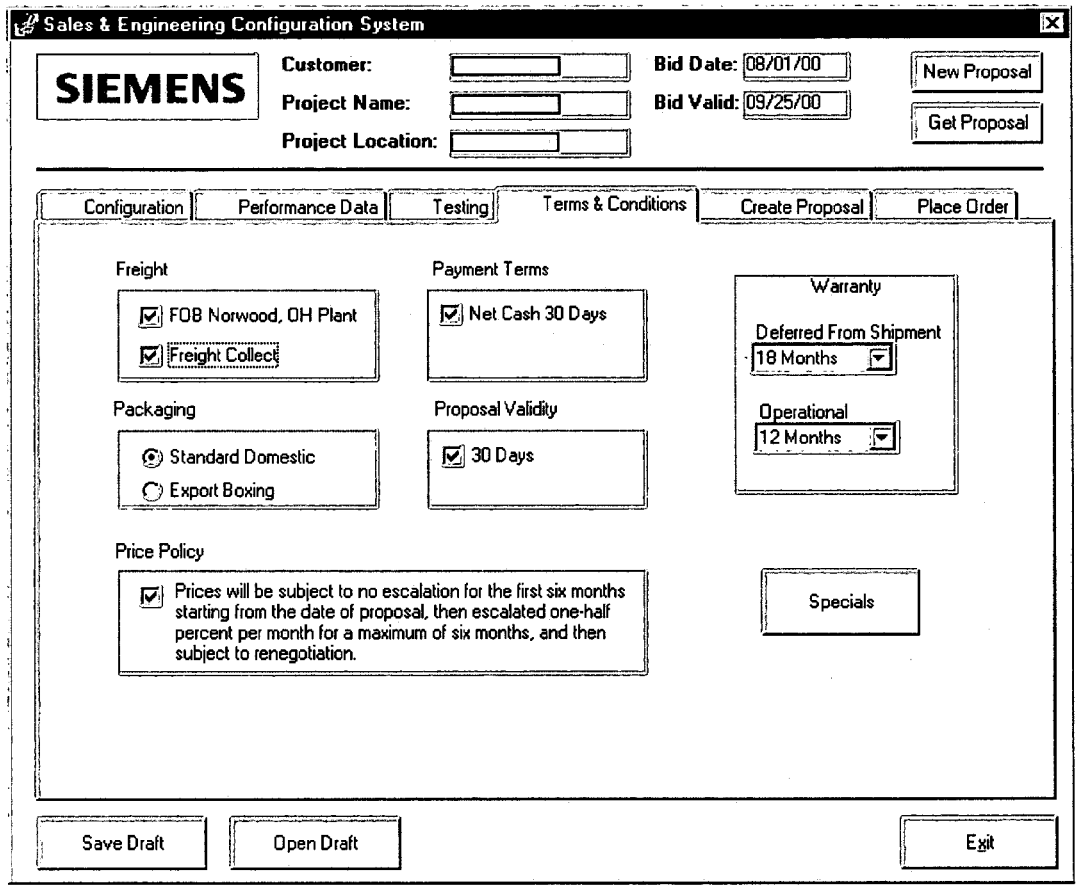
FIG. 15 is an exemplary user interface for specifying terms and conditions for a proposal.

FIG. 15 is an exemplary user interface for specifying terms and conditions for a proposal.

Figure 16:
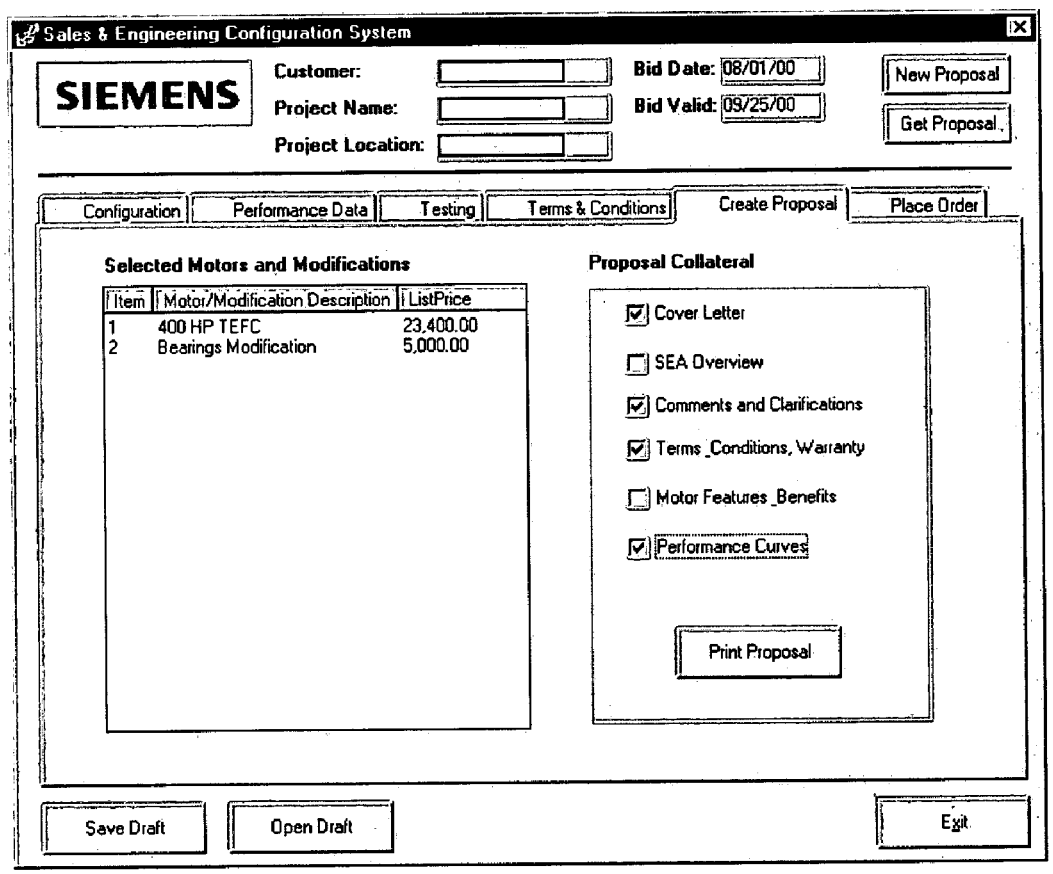
FIG. 16 is an exemplary user interface for specifying components of a proposal packet.

FIG. 16 is an exemplary user interface for specifying components of a proposal packet.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of the appended claims. For example, regardless of the content of any portion (e.g., title, field, background, summary, abstract, drawing figure, etc.) of this application, unless clearly specified to the contrary, there is no requirement for the inclusion in any claim of the application of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all subranges therein. Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render a claim invalid, then any such conflicting information in such incorporated by reference material is specifically not incorporated by reference herein.

What is claimed is:

1. A computer-assisted method for designing an electric motor, the method comprising:
   automatically authenticating a pre-approved user, the pre-approved user utilizing an Internet browser;
   receiving a value for a first design parameter related to the electric motor from the pre-approved user;
   automatically providing to a user interface a pre-determined set of alternatives for a second design parameter, wherein at least one value is selectable from the pre-determined set of alternatives, the pre-determined set of alternatives generated responsive to the value of the first design parameter;
   if a value for each design parameter received from the pre-approved user is within a pre-determined set for that design parameter;
   automatically designing predetermined aspects of the electric motor responsive to at least one of the design parameter values; and
   electronically providing a document regarding a designed electric motor to the user, the document selected from a dimensioned drawing of the electric motor, a performance curve of the electric motor, and a customer data sheet of the electric motor.

2. The method of claim 1, wherein:
if a value for a design parameter received from the pre-approved user is not within a pre-determined set for the design parameter, electronically providing the user with a pre-determined suggestion for the value for the design parameter.

3. The method of claim 1, wherein:
if a value for a design parameter received from the pre-approved user is not within a pre-determined set for the design parameter, electronically forwarding a request for an electric motor design to an engineering entity.

4. The method of claim 1, further comprising:
pre-approving a user for requesting information related to the electric motor.

5. The method of claim 1, further comprising:
automatically initiating transmission of at least one dimensioned drawing of the electric motor to the pre-approved user in real-time if each design parameter value related to the electric motor from the pre-approved user is within a pre-determined set for that parameter.

6. The method of claim 1, further comprising:
initiating electronic transmission of at least one dimensioned drawing of the electric motor to the pre-approved user if at least one value of a design parameter related to the electric motor from the pre-approved user is not within a pre-determined set for that parameter.

7. The method of claim 1, further comprising:
automatically initiating transmission of at least one performance curve of the electric motor to the pre-approved user in real-time if each design parameter value related to the electric motor from the pre-approved user is within a pre-determined set for that parameter.

8. The method of claim 1, further comprising:
initiating electronic transmission of at least one performance curve of the electric motor to the pre-approved user if at least one design parameter value related to the electric motor from the pre-approved user is not within a pre-determined set for that parameter.

9. The method of claim 1, further comprising:
automatically initiating transmission of at least one customer data sheet of the electric motor to the pre-approved user in real-time if each design parameter value related to the electric motor from the pre-approved user is within a pre-determined set for that parameter.

10. The method of claim 1, further comprising:
initiating electronic transmission of at least one customer data sheet of the electric motor to the pre-approved user if at least one design parameter value related to the electric motor from the pre-approved user is not within a pre-determined set for that parameter.

11. The method of claim 1, further comprising:
automatically validating at least one design parameter value related to the electric motor.

12. The method of claim 1, further comprising:
electronically receiving an order for the electric motor from the user.

13. The method of claim 1, further comprising:
automatically providing at least one engineering drawing to a purchasing entity responsive to an order for the electric motor.

14. The method of claim 1, further comprising:
automatically providing an engineering drawing related to the electric motor to a manufacturing entity.

15. The method of claim 1, further comprising:
automatically ordering materials for the electric motor.

16. The method of claim 1, further comprising:
automatically scheduling manufacturing of the electric motor.

17. The method of claim 1, further comprising:
automatically scheduling delivery of the electric motor to the user.

18. A user interface comprising:
an authentication element adapted to receive a pre-approved user identification parameter value and a pre-approved user authentication parameter value;
a data entry element adapted to receive a value for each of a plurality of design parameters of an electric motor, the values provided by a pre-approved user;
a document request element adapted to:
if each of said user-provided values is within a predetermined set for the corresponding design parameter, automatically request an automatic design of predetermined aspects of the electric motor and a real-time transmission to the user of a rendering of at least one document related to and consistent with the automatic design of the electric motor, the document selected from a dimensioned drain of the electric motor, a performance curve of the electric motor, and a customer data sheet of the electric motor.

19. The user interface of claim 18, wherein said document request element is adapted to:
if a user-provided value is not within the predetermined set for a corresponding design parameter, automatically request transmission of said user-provided design parameter values to an engineering entity for design of predetermined aspects of the electric motor and transmission to the user of a rendering of at least one document related to and consistent with the automatic design of the electric motor.

20. The user interface of claim 18, wherein said document request element is adapted to:
if a user-provided value is not within the predetermined set for a corresponding design parameter, automatically request transmission of said user-provided design parameter values to an engineering entity for generation by the engineering entity of a suggestion for the user-provided value.

21. The user interface of claim 18, wherein the at least one document comprises a quotation.

22. The user interface of claim 18, wherein the at least one document comprises a dimensioned drawing.

23. The user interface of claim 18, wherein the at least one document comprises a performance curve.

24. The user interface of claim 18, wherein the at least one document comprises a customer data sheet.

25. The user interface of claim 18, further comprising:
a first data entry element adapted to accept a value of a first design parameter related to the electric motor; and
a second data entry element adapted to accept a value of second design parameter related to the electric motor, the value of the second design parameter selectable from a pre-determined list, the pre-determined list generated responsive to the value of the first design parameter.

26. The user interface of claim 18, further comprising:
a configuration input element adapted to accept a configuration of the electric motor.

27. The user interface of claim 18, further comprising:
an engineering request element adapted to electronically communicate information related to the electric motor to an engineering module adapted to automatically design the electric motor if each of said user-provided values is within a predetermined set for the corresponding design parameter.

28. The user interface of claim 18, wherein said user interface is adapted to cause a display of a second user interface, the second user interface adapted to automatically communicate information related to the electric motor to an engineering entity adapted to design the electric motor if a user-provided value is not within a predetermined set for the corresponding design parameter.

29. The user interface of claim 18, further comprising:
a materials ordering element adapted to electronically communicate information related to the electric motor to a purchasing entity adapted to purchase parts related to the electric motor.

30. The user interface of claim 18, further comprising:
a manufacturing communications element adapted to electronically communicate information related to the electric motor to a manufacturing entity adapted to schedule a manufacturing activity related to the electric motor.

31. The user interface of claim 18, further comprising:
a logistics communications element adapted to electronically communicate information related to the electric motor to a shipping entity adapted to schedule a delivery activity related to the electric motor.

32. The user interface of claim 18, further comprising:
a user prompting element adapted to prompt the user regarding at least one design parameter related to the electric motor.

* * * * *